(12) United States Patent
Koba (10) Patent No.: US 6,291,365 B1
(45) Date of Patent: Sep. 18, 2001

(54) METHOD FOR MANUFACTURING THIN GATE SILICON OXIDE LAYER

(75) Inventor: Fumihiro Koba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/501,957

(22) Filed: Feb. 10, 2000

(30) Foreign Application Priority Data

Feb. 10, 1999 (JP) .................................................. 11-033253

(51) Int. Cl.[7] .......................... H01L 21/31; H01L 21/469; H01L 21/3205; H01L 21/4763

(52) U.S. Cl. ..................... 438/770; 438/585; 438/591; 438/773; 438/774; 438/787

(58) Field of Search .................................... 438/585, 591, 438/770, 773, 774, 787

(56) References Cited

U.S. PATENT DOCUMENTS

| 4,584,205 | | 4/1986 | Chen et al. . | |
|---|---|---|---|---|
| 5,057,463 | | 10/1991 | Bryant et al. . | |
| 5,244,843 | | 9/1993 | Chau et al. . | |
| 5,393,683 | * | 2/1995 | Mathews et al. | 438/770 |
| 5,821,172 | * | 10/1998 | Gilmer et al. | 438/769 |
| 5,840,610 | * | 11/1998 | Gilmer et al. | 438/310 |
| 5,855,870 | * | 3/1999 | Maiti et al. | 438/261 |
| 5,926,741 | * | 7/1999 | Matsuoka et al. | 438/778 |
| 5,960,302 | * | 9/1999 | Ma et al. | 438/585 |
| 6,165,849 | * | 12/2000 | An et al. | 438/275 |

FOREIGN PATENT DOCUMENTS

| 57-207366 | 12/1982 | (JP) . |
|---|---|---|
| 2-303134 | 12/1990 | (JP) . |
| 4-186835 | 7/1992 | (JP) . |
| 05-129596 | 5/1993 | (JP) . |
| 7-66193 | 3/1995 | (JP) . |
| 7-273323 | 10/1995 | (JP) . |
| 8-172138 | 7/1996 | (JP) . |
| 11-340224 | 12/1999 | (JP) . |

OTHER PUBLICATIONS

Journal of the Electrochemical Society, vol. 140, No. 6, pp 1744–1747, Jun. 1993, HR Soleimani and A Philipossian, "An investigation of two step oxidation in dry oxidation in dry oxygen and the effect of thermal history on its growth properties".

* cited by examiner

Primary Examiner—Tuan H. Nguyen
Assistant Examiner—Erik Kielin (57) ABSTRACT

In a method for manufacturing a semiconductor device where a silicon substrate is loaded in an oxidation furnace whose temperature is a first value, the temperature of the oxidation furnace is raised to a second value, and an oxidation operation is performed upon the silicon substrate to grow an essential silicon oxide layer on the silicon, a thickness ratio of an initial silicon oxide layer grown before the oxidation operation performing step to a less than 40 Å thick gate silicon oxide layer formed by the initial silicon oxide layer and the essential silicon oxide layer is about 20 to 40 percent.

15 Claims, 9 Drawing Sheets

METHOD FOR MANUFACTURING THIN GATE SILICON OXIDE LAYER

BACKGROUND OF THE INVENTION

Field of the Invention

The present invention relates to a method for manufacturing a semiconductor device, and more particularly, to a method for manufacturing a less than 40 Å thick gate silicon oxide layer used in a metal oxide semiconductor (MOS) transistor or the like.

In a prior art method for manufacturing a MOS transistor or the like where a silicon substrate is loaded in an oxidation furnace whose temperature is about 300 to 700° C., the temperature of the oxidation furnace is raised to 750 to 900° C., and an oxidation operation is performed upon the silicon substrate to grow an essential silicon oxide layer on the silicon. In this case, an initial silicon oxide layer is grown before the growth of the essential silicon oxide layer. That is, in order to grow the initial silicon oxide layer, a mixture gas of 1 to 2 percent oxygen ($O_2$) and nitrogen is supplied to the furnace during the silicon substrate loading step and the temperature raising step (see: JP-A-4-186835). This will be explained later in detail.

Note that an entire gate silicon oxide layer is formed by the initial silicon oxide layer plus the essential silicon oxide layer.

Although the initial silicon oxide layer is poor in terms of quality, the initial silicon oxide layer serves as a cap layer for preventing the silicon substrate from migrating at about 750 to 900° C. where the essential silicon oxide layer is grown. Therefore, the initial silicon oxide layer suppresses the roughness of the surface of the silicon substrate, so as to obtain a favorable interface between the silicon substrate and the gate silicon oxide layer, which would improve the reliability of the gate silicon oxide layer.

In the gate silicon oxide layer, however, since the initial silicon oxide layer is grown in both of the silicon substrate loading step and the temperature raising step where the concentration of oxygen flowing through the furnace is high, i.e., 1 to 2 percent, when the gate silicon oxide layer is too thin, for example, less than about 40 Å, the ratio of the initial silicon oxide layer to the entire gate silicon oxide layer becomes larger than about 50 percent, which would deteriorate the entire gate silicon oxide layer.

SUMMARY OF THE INVENTION

It is an object of the present invention to improve a less than 40 Å thick gate silicon oxide layer.

According to the present invention, in a method for manufacturing a semiconductor device where a silicon substrate is loaded in an oxidation furnace whose temperature is a first value, the temperature of the oxidation furnace is raised to a second value, and an oxidation operation is performed upon the silicon substrate to grow an essential silicon oxide layer on the silicon substrate, a thickness ratio of an initial silicon oxide layer grown before the oxidation operation performing step to a less than 40 Å thick gate silicon oxide layer formed by the initial silicon oxide layer and the essential silicon oxide layer is about 20 to 40 percent.

When the thickness ratio of the initial silicon oxide layer to the entire gate silicon oxide layer is about 20 to 40 percent, the deterioration of the entire gate silicon oxide layer is suppressed while the roughness characteristics of the surface of a silicon substrate as well as the interface between the silicon substrate and the gate silicon oxide layer are maintained.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art method for manufacturing a MOS transistor will be explained with reference to FIGS. 1A, 1B, 1C and 1D.

Figure 1A:
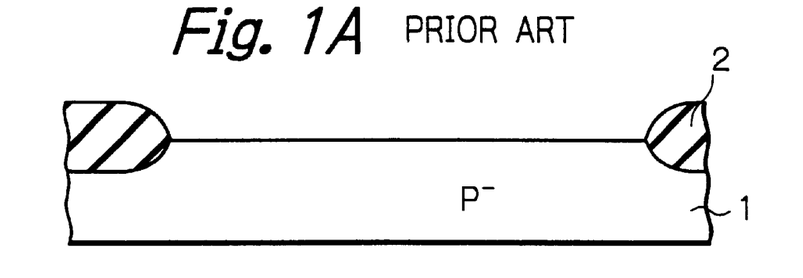
FIGS. 1A through 1D are cross-sectional views for explaining a prior art method for manufacturing a MOS transistor.

First, referring to FIG. 1A, a P⁻-type monocrystalline silicon substrate 1 is thermally oxidized by a local oxidation of silicon (LOCOS) process to grow a field silicon oxide layer 2 thereon.

Figure 1B:
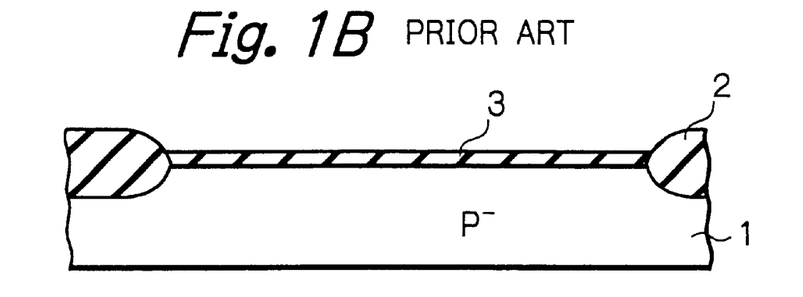

Next, referring to FIG. 1B, a gate silicon oxide layer 3 is formed by thermally oxidizing the silicon substrate 1.

Figure 1C:
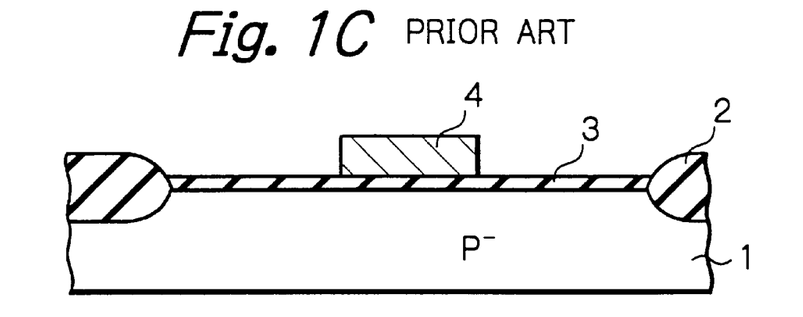

Next, referring to FIG. 1C, a polycrystalline silicon layer and/or a refractory metal layer are deposited on the gate silicon oxide layer 3 and are patterned by a photolithography and etching process to form a gate electrode 4.

Figure 1D:
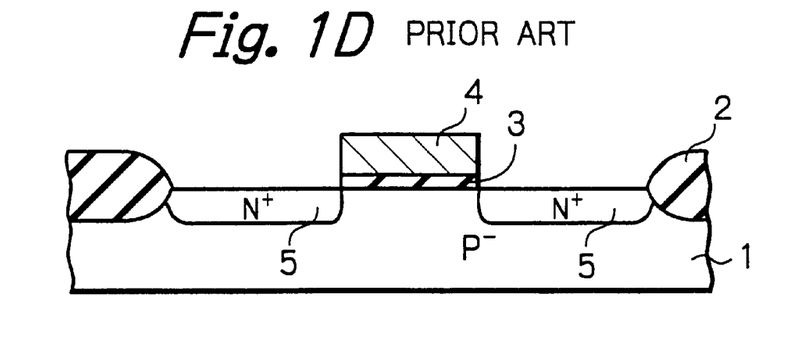

Finally, referring to FIG. 1D, the gate silicon oxide layer 3 is etched by using the gate electrode 4 as a mask. Then, N-type impurity ions such as arsenic ions are implanted into the silicon substrate 1 in self-alignment with the gate electrode 4 to form high impurity regions (source/drain regions) 5 within the silicon substrate 1. Thus, a MOS transistor is completed.

The formation of the gate silicon oxide layer 3 is explained next with reference to FIG. 2.

Before the formation of the gate silicon oxide layer 3, a wafer where the field silicon oxide layer 2 is formed as illustrated in FIG. 1A is put into a dilute fluoric acid solution, so that contamination as well as natural silicon oxide is removed therefrom.

First, at time t0, the wafer is loaded in an oxidation furnace whose temperature is about 300 to 700° C. and where a mixture gas of 1 to 2 percent oxygen ($O_2$) and nitrogen ($N_2$) flows through.

Next, at time t1, the temperature of the furnace is raised at a constant rate such as about 10 deg/min. Also, in this state, the above-mentioned mixture gas flows through the furnace.

Next, at time t2, the furnace is maintained at a definite temperature such as about 750 to 900° C. Also, in the furnace, the flow of the mixture gas of 1 to 2 percent $O_2/N_2$ is switched to that of pure oxygen gas, to carry out a dry oxidation process.

Next, at time t3, the temperature of the furnace is lowered at a constant rate such as about 10 deg/min. Simultaneously, the flow of the pure oxygen gas is switched to that of pure nitrogen gas, to stop the dry oxidation process.

Next, at time t4, the operation of lowering the temperature of the furnace is stopped, so that the temperature of the furnace returns to about 300 to 700° C.

Finally, at time t5, the wafer is unloaded from the furnace.

Figure 2:
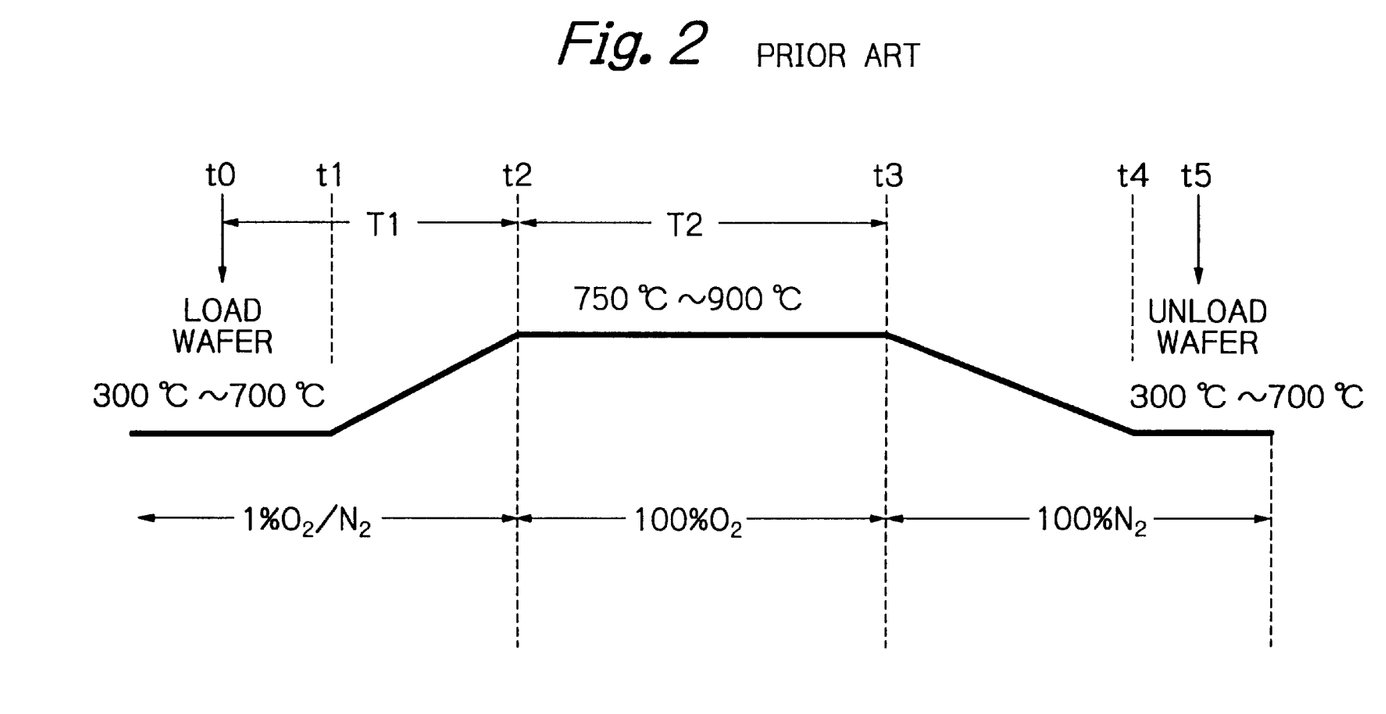
FIG. 2 is a temperature sequence diagram of an oxidation furnace for explaining a prior art method for manufacturing the gate silicon oxide layer of FIGS. 1A through 1D.
Figure 3:
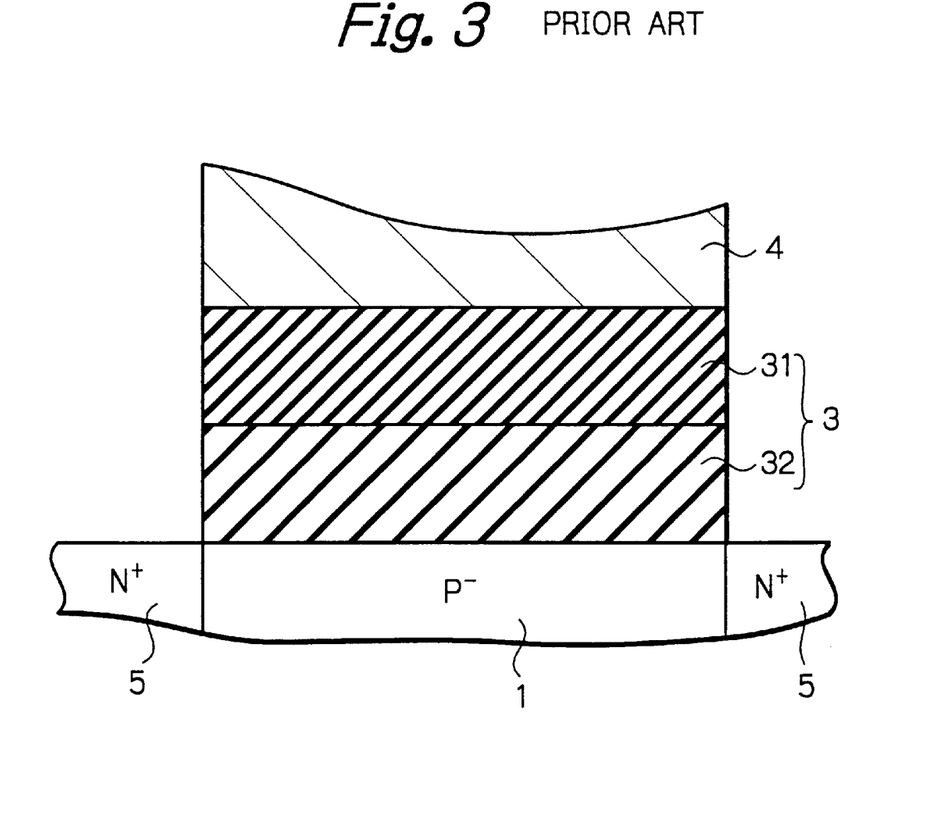
FIG. 3 is a cross-sectional view of the gate silicon oxide layer obtained by the prior art method as illustrated in FIG. 2.

The gate silicon oxide layer 3 obtained by a heating process as shown in FIG. 2 is illustrated in FIG. 3. That is, the gate silicon oxide layer 3 consists of an initial silicon oxide layer 31 grown from time t0 to time t2 of FIG. 2 and an essential silicon oxide layer 32 grown from time t2 to time t3 of FIG. 2.

The thickness $TOX_{initial}$ of the initial silicon oxide layer 31 can be changed by adjusting a time period T1 from time t0 to time t2, while the thickness $TOX_{essential}$ of the essential silicon oxide layer 32 can be changed by adjusting a time period T2 from time t2 to time t3.

Although the initial silicon oxide layer 31 is poor in terms of quality, the initial silicon oxide layer 31 serves as a cap layer for preventing the silicon substrate 1 from migrating at about 750 to 900° C. where the essential silicon oxide layer 32 is grown. Therefore, the initial silicon oxide layer 31 suppresses the roughness of the surface of the silicon substrate 1, so as to obtain a favorable interface between the silicon substrate 1 and the gate silicon oxide layer 3, which would improve the reliability of the gate silicon oxide layer 3.

In the gate silicon oxide layer 3 of FIG. 3, however, since the initial silicon oxide layer 31 is grown from time t1 to time t2 in addition to from time t0 to time t1 where the concentration of oxygen flowing through the furnace is high, i.e., 1 to 2 percent, when the gate silicon oxide layer 3 is too thin, for example, less than about 40 Å, the ratio of the initial silicon oxide layer 31 to the entire gate silicon oxide layer 3 becomes larger than about 50 percent, which would deteriorate the entire gate silicon oxide layer 3. Note that, if the gate silicon oxide layer 3 is 40 Å thick, the initial gate silicon oxide layer 31 is 18 Å.

A first embodiment of the method for manufacturing the gate silicon oxide layer 3 according to the present invention is explained next with reference to FIG. 4.

Before the formation of the gate silicon oxide layer 3, a wafer where the field silicon oxide layer 2 is formed as illustrated in FIG. 1A is put into a dilute fluoric acid solution, so that contamination as well as natural silicon oxide is removed therefrom.

First, at time t0, the wafer is loaded in an oxidation furnace whose temperature is about 300 to 700° C. and where a mixture gas of about 1 to 2 percent oxygen ($O_2$) and nitrogen ($N_2$) flows through.

Next, at time t1, the temperature of the furnace is raised at a constant rate such as about 10 deg/min. Also, in this state, pure nitrogen gas flows through the furnace, thus stopping the growth of initial silicon oxide.

Next, at time t2, the furnace is maintained at a definite temperature such as about 750 to 900° C. Also, in the furnace, the flow of the pure nitrogen is switched to that of pure oxygen gas, to carry out a dry oxidation process.

Next, at time t3, the temperature of the furnace is lowered at a constant rate such as about 10 deg/min. Simultaneously, the flow of the pure oxygen gas is switched to that of pure nitrogen gas, to stop the dry oxidation process.

Next, at time t4, the operation of lowering the temperature of the furnace is stopped, so that the temperature of the furnace returns to about 300 to 700° C.

Finally, at time t5, the wafer is unloaded from the furnace.

Figure 4:
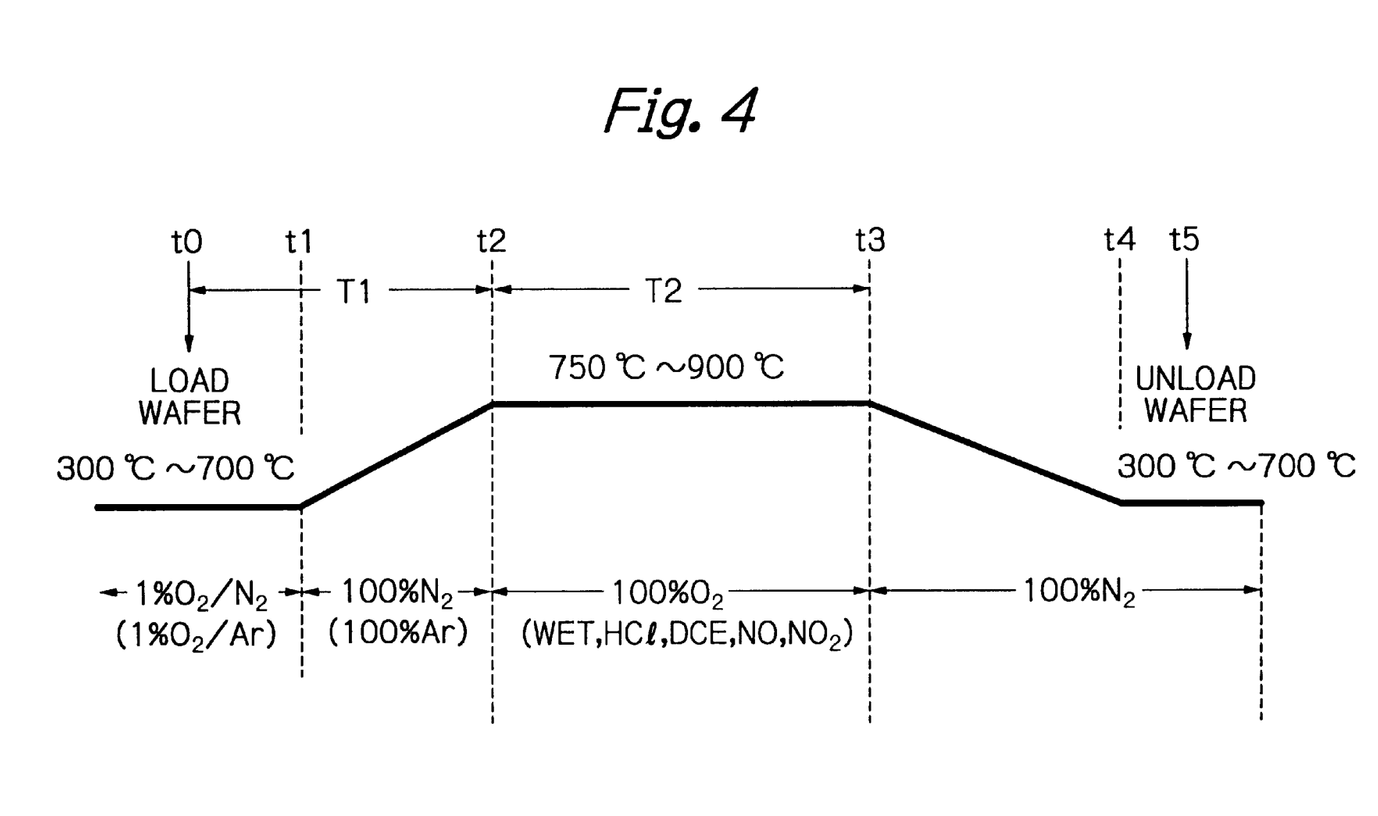
FIG. 4 is a temperature sequence diagram of an oxidation furnace for explaining a first embodiment of the method for manufacturing a gate silicon oxide layer according to the present invention.
Figure 5:
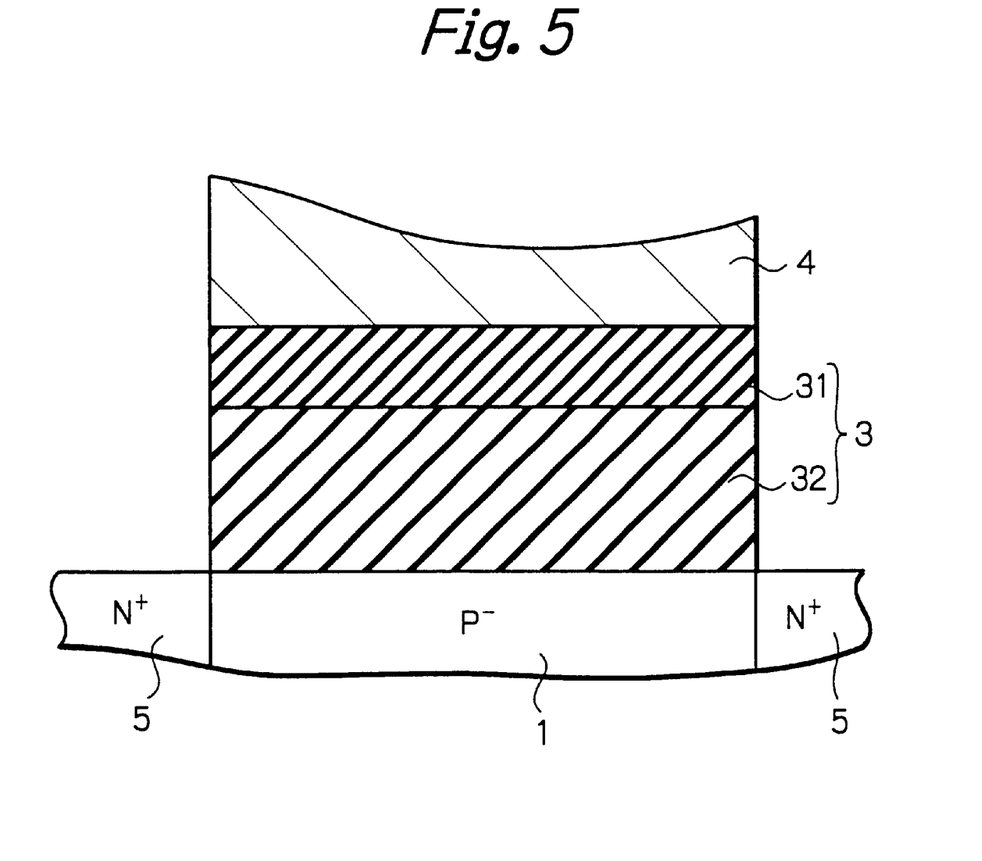
FIG. 5 is a cross-sectional view of the gate silicon oxide layer obtained by the first embodiment as illustrated in FIG. 4.

The gate silicon oxide layer 3 obtained by a heating process as shown in FIG. 4 is illustrated in FIG. 5. That is, the gate silicon oxide layer 3 consists of an initial silicon oxide layer 31 grown from time t0 to time t1 of FIG. 4 and an essential silicon oxide layer 32 grown from time t2 to time t3 of FIG. 4.

The thickness $TOX_{initial}$ of the initial silicon oxide layer 31 can be changed by adjusting a time period T1 from time t0 to time t1, while the thickness $TOX_{essential}$ of the essential silicon oxide layer 32 can be changed by adjusting a time period T2 from time t2 to time t3.

Figure 6A:
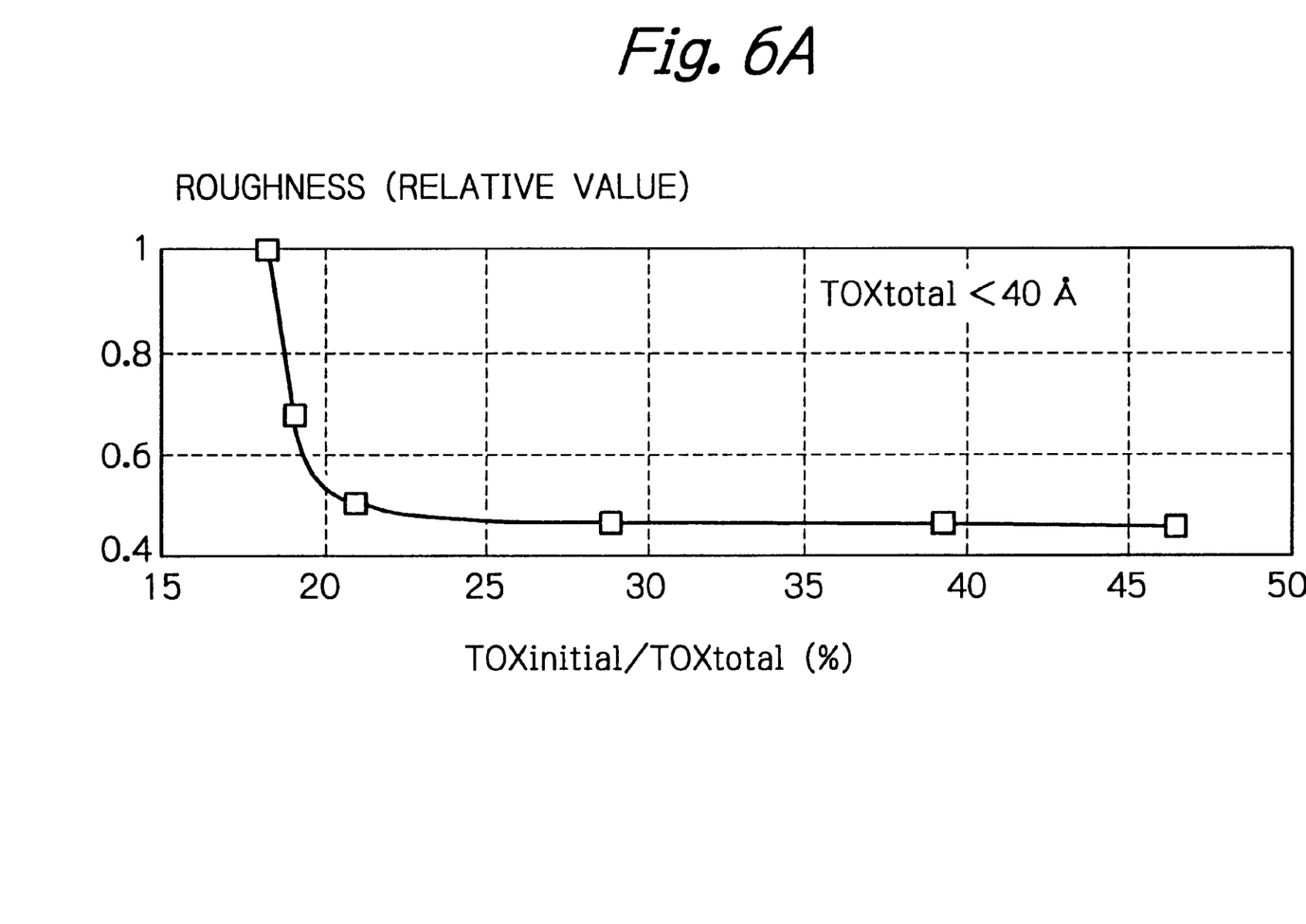
FIG. 6A is a graph showing a relationship between the roughness characteristics and the ratio of the initial silicon oxide layer to the entire gate silicon oxide layer of FIG. 5.

As stated above, although the initial silicon oxide layer 31 is poor in terms of quality, the initial silicon oxide layer 31 serves as a cap layer for preventing the silicon substrate 1 from migrating at about 750 to 900° C. where the essential silicon oxide layer 32 is grown. Therefore, as shown in FIG. 6A, when the ratio $TOX_{initial}/TOX_{total}$ where $TOX_{total}$+ $TOX_{initial}$+$TOX_{essential}$ is larger than about 20 percent, the initial silicon oxide layer 31 suppresses the roughness of the surface of the silicon substrate 1, so as to obtain a favorable interface between the silicon substrate 1 and the gate silicon oxide layer 3, which would improve the reliability of the gate silicon oxide layer 3, as shown in FIG. 6B.

Figure 6B:
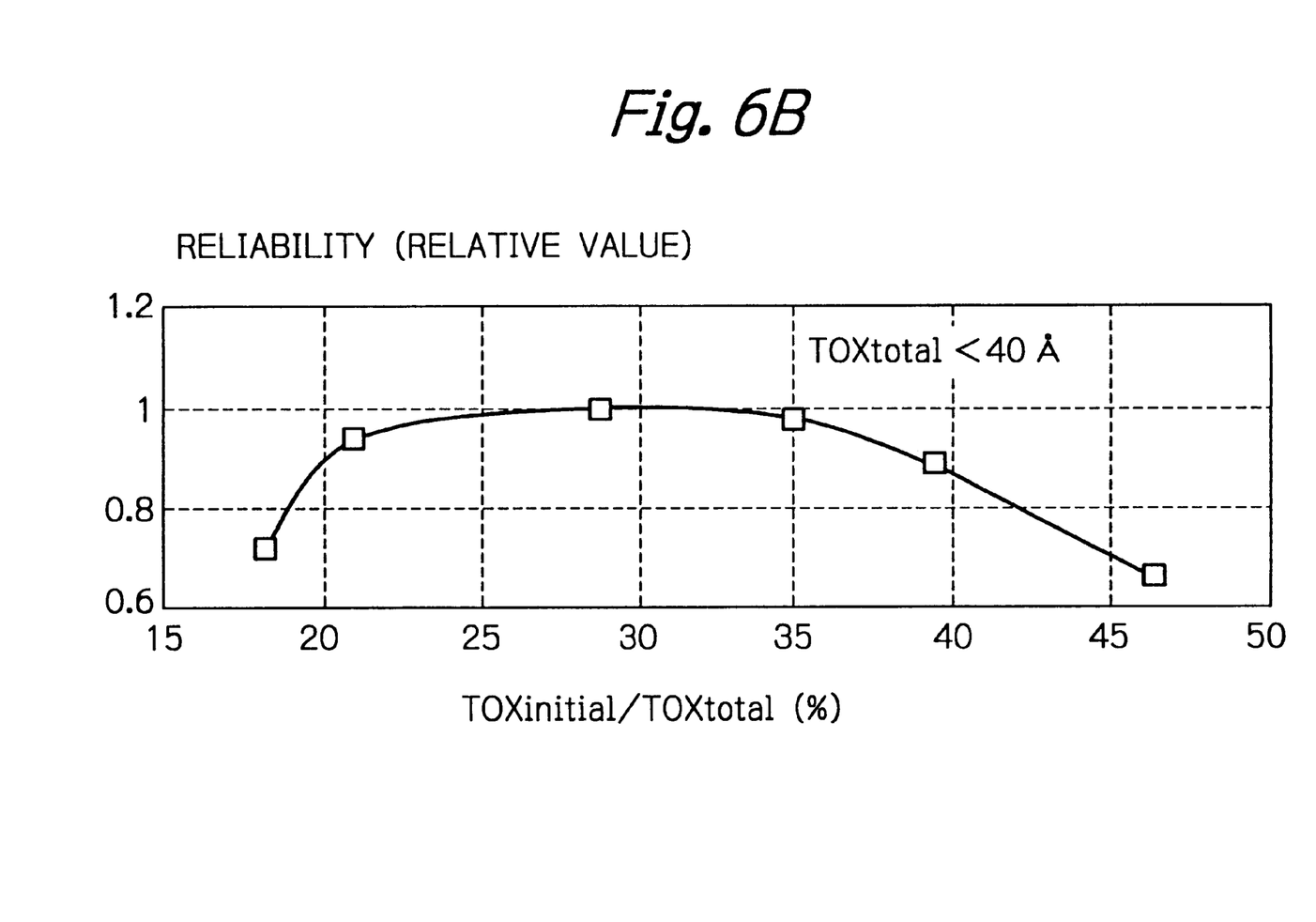
FIG. 6B is a graph showing a relationship between the reliability of the gate silicon oxide layer and the ratio of the initial silicon oxide layer to the entire gate silicon layer of FIG. 5.

Further, in the gate silicon oxide layer 3 of FIG. 5, since the initial silicon oxide layer 31 is grown only from time t0 to time t1, even when the gate silicon oxide layer 3 is too thin, for example, less than about 40 Å, the ratio of the initial silicon oxide layer 31 to the entire gate silicon oxide layer 3 becomes smaller than about 40 percent, which would suppress deterioration of the entire gate silicon oxide layer 3 as shown in FIG. 6B.

A second embodiment of the method for manufacturing the gate silicon oxide layer 3 according to the present invention is explained next with reference to FIG. 7.

Before the formation of the gate silicon oxide layer 3, a wafer where the field silicon oxide layer 2 is formed as illustrated in FIG. 1A, the wafer is put into a dilute fluoric acid solution, so that contamination as well as natural silicon oxide is removed therefrom.

First, at time t0, the wafer is loaded in an oxidation furnace whose temperature is about 300 to 700° C. and where a mixture gas of about 0.5 percent oxygen ($O_2$) and nitrogen ($N_2$) flows through.

Next, at time t1, the temperature of the furnace is raised at a constant rate such as about 10 deg/min. Also, in this state, the above-mentioned gas mixture flows through the furnace, thus continuing the growth of initial silicon oxide.

Next, at time t2, the furnace is maintained at a definite temperature such as about 750 to 900° C. Also, in the furnace, the flow of the mixture gas of 0.5 percent $O_2/N_2$ is switched to that of pure oxygen gas, to carry out a dry oxidation process.

Next, at time t3, the temperature of the furnace is lowered at a constant rate such as about 10 deg/min. Simultaneously, the flow of the pure oxygen gas is switched to that of pure nitrogen gas, to stop the dry oxidation process.

Next, at time t4, the lowering operation of the temperature of the furnace is stopped, so that the temperature of the furnace returns to about 300 to 700° C.

Finally, at time t5, the wafer is unloaded from the furnace.

Figure 7:
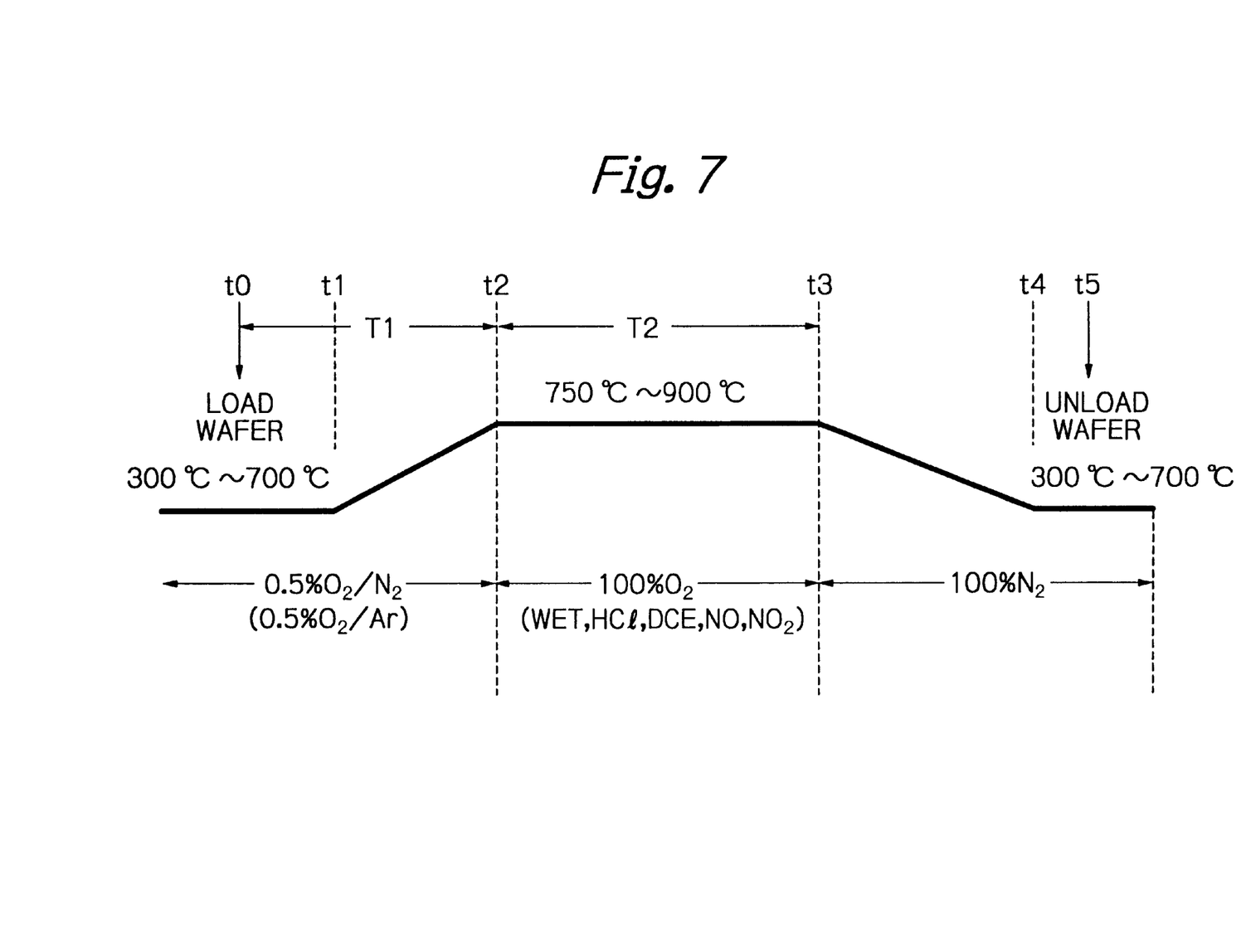
FIG. 7 is a temperature sequence diagram of an oxidation furnace for explaining a second embodiment of the method for manufacturing a gate silicon oxide layer according to the present invention.

The gate silicon oxide layer 3 obtained by a heating process as shown in FIG. 7 is also illustrated in FIG. 5. That is, the gate silicon oxide layer 3 consists of an initial silicon oxide layer 31 grown from time t0 to time t2 of FIG. 7 and an essential silicon oxide layer 32 grown from time t2 to time t3 of FIG. 7.

The thickness $TOX_{initial}$ of the initial silicon oxide layer 31 can be changed by adjusting a time period T1 from time t0 to time t2, while the thickness $TOX_{essential}$ of the essential silicon oxide layer 32 can be changed by adjusting a time period T2 from time t2 to time t3.

As stated above, although the initial silicon oxide layer 31 is poor in terms of quality, the initial silicon oxide layer 31 serves as a cap layer for preventing the silicon substrate 1 from migrating at about 750 to 900° C. where the essential silicon oxide layer 32 is grown. Therefore, in the same way as in the first embodiment, when the ratio $TOX_{initial}/TOX_{total}$ where $TOX_{total}=TOX_{initial}+TOX_{essential}$ is larger than about 20 percent, the initial silicon oxide layer 31 suppresses the roughness of the surface of the silicon substrate 1, so as to obtain a favorable interface between the silicon substrate 1 and the gate silicon oxide layer 3, which would improve the reliability of the gate silicon oxide layer 3.

Further, in the gate silicon oxide layer 3 of FIG. 5 obtained by the second embodiment, although the initial silicon oxide layer 31 is grown from time t1 to time t2 in addition to from time t0 to time t1, the concentration of oxygen flowing through the furnace is low, i.e., about 0.5 percent. Therefore, even when the gate silicon oxide layer 3 is too thin, for example, less than about 40 A, the ratio of the initial silicon oxide layer 31 to the entire gate silicon oxide layer 3 becomes smaller than about 40 percent, which would suppress deterioration of the entire gate silicon oxide layer 3 as shown in FIG. 6B.

A third embodiment of the method for manufacturing the gate silicon oxide layer 3 according to the present invention is explained next with reference to FIG. 8.

Before the formation of the gate silicon oxide layer 3, a wafer where the field silicon oxide layer 2 is formed as illustrated in FIG. 1A is subjected to a wet processing step using an ammonia water/hydrogen peroxide water mixture (APM), a hydrosulfurous acid/hydrogen peroxide water (HPM) or the like to remove contamination therefrom. In this case, a chemical silicon oxide layer having a thickness of about 10 to 15 Å is grown on the silicon substrate 1. This chemical silicon oxide layer serves as an initial silicon oxide layer.

First, at time t0, the wafer is loaded in an oxidation furnace whose temperature is about 300 to 700° C. and where pure and nitrogen ($N_2$) gas flows through.

Next, at time t1, the temperature of the furnace is raised at a constant rate such as about 10 deg/min. Also, in this state, pure nitrogen gas flows through the furnace.

Thus, the initial silicon oxide layer is hardly grown from time t0 to time t2.

Next, at time t2, the furnace is maintained at a definite temperature such as about 750 to 900° C. Also, in the furnace, the flow of the pure nitrogen gas is switched to that of pure oxygen gas, to carry out a dry oxidation process.

Next, at time t3, the temperature of the furnace is lowered at a constant rate such as about 10 deg/min. Simultaneously, the flow of the pure oxygen gas is switched to that of pure nitrogen gas, to stop the dry oxidation process.

Next, at time t4, the operation of lowering the temperature of the furnace is stopped, so that the temperature of the furnace returns to about 300 to 700° C.

Finally, at time t5, the wafer is unloaded from the furnace.

Figure 8:
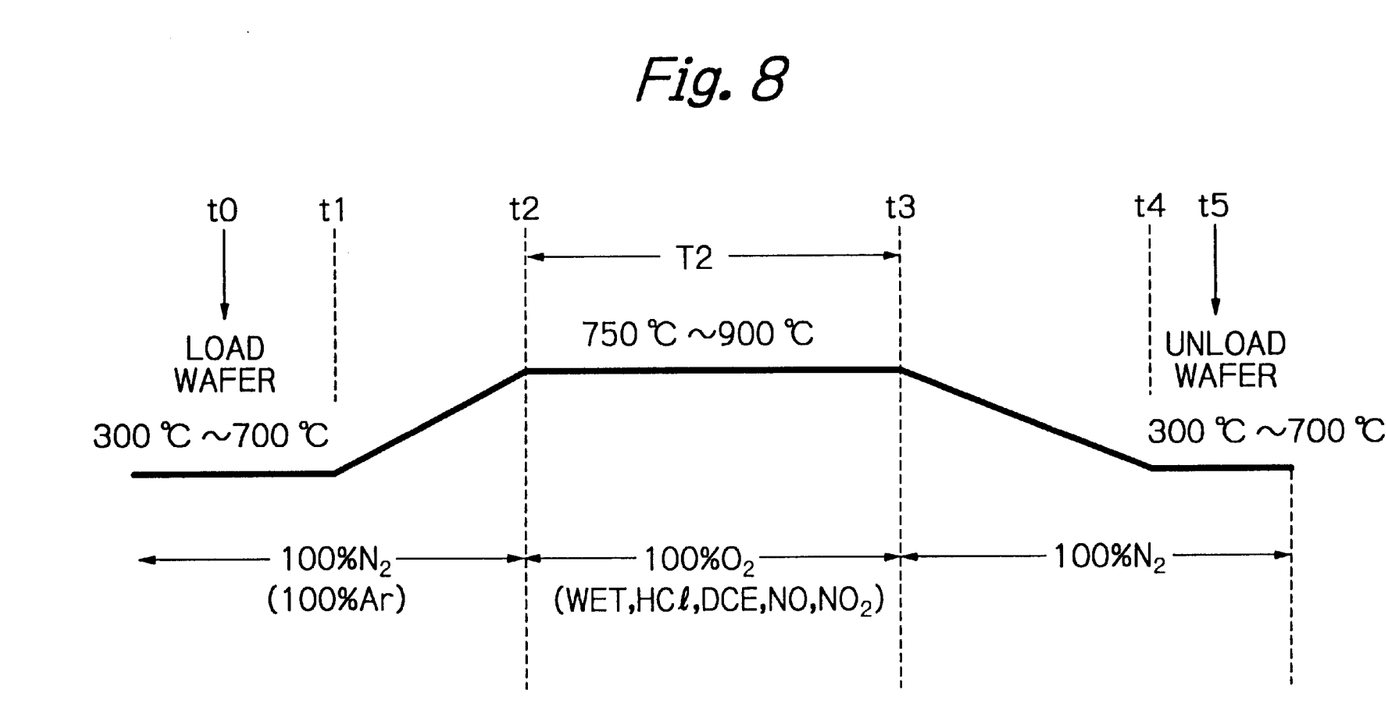
FIG. 8 is a temperature sequence diagram of an oxidation furnace for explaining a third embodiment of the method for manufacturing a gate silicon oxide layer according to the present invention.

The gate silicon oxide layer 3 obtained by a heating process as shown in FIG. 8 is also illustrated in FIG. 5. That is, the gate silicon oxide layer 3 consists of an initial silicon oxide layer 31 which corresponds to the chemical silicon oxide layer and an essential silicon oxide layer 32 grown from time t2 to time t3 of FIG. 8.

The thickness $TOX_{initial}$ of the initial silicon oxide layer 31 is definite, while the thickness $TOX_{essential}$ of the essential silicon oxide layer 32 can be changed by adjusting a time period T2 from time t2 to time t3.

Note that, although the initial silicon oxide layer (chemical silicon oxide layer) 31 is poor in terms of quality, the initial silicon oxide layer 31 serves as a cap layer for preventing the silicon substrate 1 from migrating at about 750 to 900° C. where the essential silicon oxide layer 32 is grown. In this case, the initial silicon oxide layer 31 is very thin. Therefore, in the same way as in the first embodiment, when the ratio $TOX_{initial}/TOX_{total}$ where $TOX_{total}=TOX_{initial}+TOX_{essential}$ is larger than about 20 percent, the initial silicon oxide layer 31 suppresses the roughness of the surface of the silicon substrate 1, so as to obtain a favorable interface between the silicon substrate 1 and the gate silicon oxide layer 3, which would improve the reliability of the gate silicon oxide layer 3.

Further, in the gate silicon oxide layer 3 of FIG. 5 obtained by the third embodiment, even when the gate silicon oxide layer 3 is too thin, for example, less than about 40 Å, the ratio of the initial silicon oxide layer 31 to the entire gate silicon oxide layer 3 becomes smaller than about 40 percent, which would suppress deterioration of the entire gate silicon oxide layer 3 as shown in FIG. 6B.

In the above-described embodiments, although nitrogen gas is used from time t0 to time t2, other inert gas such as argon (Ar) gas can be used instead of nitrogen gas. Also, in the second embodiment, the ratio of oxygen to the gas mixture from time t0 to time t2 can be between 0.4 percent and 1 percent. Further, in all the embodiments, a wet oxidation process using pure water steam, a hydrochloric acid (HCl) oxidation process, a dichloroethylene (DCE) oxidation process, a nitrogen oxide (NO) gas oxidation process or a nitrogen dioxide ($NO_2$) gas oxidation process can be used instead of the dry oxidation process.

As explained hereinabove, according to the present invention, since the ratio of an initial silicon oxide layer to the entire gate silicon oxide layer can be about 20 to 40 percent, the deterioration of the entire gate silicon oxide layer can be suppressed while the roughness characteristics of the surface of a silicon substrate as well as the interface between the silicon substrate and the gate silicon oxide layer are maintained.

What is claimed is:

1. A method for manufacturing a semiconductor device, comprising the steps of:

loading a silicon substrate in an oxidation furnace whose temperature is a first value;

raising the temperature of said oxidation furnace from said first value to a second value larger than said first value;

performing an oxidation operation upon said silicon substrate to grow an essential silicon oxide layer on said silicon substrate, wherein a thickness ratio of an initial silicon oxide layer grown before said oxidation operation performing step to an entire gate silicon oxide layer formed by said initial silicon oxide layer and said essential silicon oxide layer is about 20 to 40 percent, said entire gate silicon oxide layer being less than 40 Å thick.

2. The method as set forth in claim 1, further comprising a step of etching natural silicon oxide on said silicon substrate before said silicon substrate loading step.

3. The method as set forth in claim 2, wherein said silicon substrate loading step comprises a step of supplying a mixture gas of oxygen and inert gas to said oxidation furnace, said temperature raising step comprising a step of supplying inert gas to said oxidation furnace.

4. The method as set forth in claim 3, wherein a ratio of oxygen to the mixture gas in said silicon substrate loading step is about 1 to 2 percent.

5. The method as set forth in claim 2, wherein said silicon substrate loading step comprises a step of supplying a mixture gas of oxygen and inert gas to said oxidation furnace, said temperature raising step comprising a step of supplying said mixture gas to said oxidation furnace.

6. The method as set forth in claim 5, wherein a ratio of oxygen to the mixture gas in said silicon substrate loading and temperature raising step is about 0.4 to 1.0 percent.

7. The method as set forth in claim 1, further comprising a step of performing a wet process upon said silicon substrate to grow a chemical silicon oxide layer on said silicon substrate as said initial silicon oxide layer before said silicon substrate loading step, said silicon substrate loading step comprising a step of supplying inert gas to said oxidation furnace, said temperature increasing step comprising a step of supplying inert gas to said oxidation furnace.

8. The method as set forth in claim 1, wherein said first value is 300 to 700° C., and said second value is 750 to 900° C.

9. The method as set forth in claim 1, wherein said oxidation process is one of a dry oxidation process, a wet oxidation process, a dichloroethylene oxidation process, a nitrogen oxide gas oxidation process and a nitrogen dioxide gas oxidation process.

10. A method for manufacturing a semiconductor device, comprising the steps of:

etching natural silicon oxide on a silicon substrate;

loading said silicon substrate in an oxidation furnace whose temperature is about 300 to 700° C. and where a mixture gas of oxygen and inert gas is supplied to grow an initial silicon oxide layer on said silicon substrate;

switching the mixture gas of oxygen and inert gas to pure inert gas to stop growth of said initial silicon oxide layer;

raising the temperature of said oxidation furnace to about 750 to 900° C., after the mixture gas of oxygen and inert gas is switched to pure inert gas;

stopping supplying of said pure inert gas, after the temperature of said oxidation furnace is raised to 750 to 900° C.; and performing an oxidation process upon said silicon substrate to grow an essential silicon oxide layer on said silicon substrate, after the supplying of said pure inert gas is stopped, a thickness ratio of said initial silicon oxide layer to said essential silicon oxide layer plus said initial silicon oxide layer being about 20 to 40 percent, said essential silicon oxide layer plus said initial silicon oxide layer being less than 40 Å thick.

11. The method as set forth in claim 10, wherein a ratio of oxygen in the mixture gas is about 1 to 2 percent.

12. A method for manufacturing a semiconductor device, comprising the steps of:

etching natural silicon oxide on a silicon substrate;

loading said silicon substrate in an oxidation furnace whose temperature is about 300 to 700° C. and where a mixture gas of oxygen and inert gas is supplied to grow an initial silicon oxide layer on said silicon substrate;

raising the temperature of said oxidation furnace to about 750 to 900° C.;

stopping supplying of said mixture gas, after the temperature of said oxidation furnace is raised to 750 to 900° C.; and performing an oxidation process upon said silicon substrate to grow an essential silicon oxide layer on said silicon substrate, after the supplying of said mixture gas is stopped, a thickness ratio of said initial silicon oxide layer to said essential silicon oxide layer plus said initial silicon oxide layer being about 20 to 40 percent, said essential silicon oxide layer plus said initial silicon oxide layer being less than 40 Å thick.

13. The method as set forth in claim 12, wherein a ratio of oxygen in the mixture gas is about 0.4 to 1.0 percent.

14. A method for manufacturing a semiconductor device, comprising the steps of:

forming a chemical silicon oxide as an initial silicon oxide layer on a silicon substrate;

loading said silicon substrate in an oxidation furnace whose temperature is about 300 to 700° C. and where inert gas is supplied;

raising the temperature of said oxidation furnace to about 750 to 900° C.;

stopping supplying of said inert gas, after the temperature of said oxidation furnace is raised to 750 to 900° C.; and performing an oxidation process upon said silicon substrate to grow an essential silicon oxide layer on said silicon substrate, after the supplying of said inert gas is stopped, a thickness ratio of said initial silicon oxide layer to said essential silicon oxide layer plus said initial silicon oxide layer being about 20 to 40 percent, said essential silicon oxide layer plus said initial silicon oxide layer being less than 40 Å thick.

15. The method as set forth in claim 14, wherein a ratio of oxygen in the mixture gas is about 0.4 to 1.0 percent.

* * * * *